(12) United States Patent
Armitage et al.

(10) Patent No.: US 11,122,689 B2
(45) Date of Patent: Sep. 14, 2021

(54) CIRCUIT ASSEMBLY

(71) Applicant: MBDA UK LIMITED, Stevenage (GB)

(72) Inventors: Adam Armitage, Bristol (GB); Thomas James Heaton, Bolton (GB)

(73) Assignee: MBDA UK LIMITED, Stevenage (GB)

(*) Notice: Subject to any disclaimer, the term of this patent is extended or adjusted under 35 U.S.C. 154(b) by 0 days.

(21) Appl. No.: 16/754,787

(22) PCT Filed: Oct. 17, 2018

(86) PCT No.: PCT/GB2018/052982
§ 371 (c)(1),
(2) Date: Apr. 9, 2020

(87) PCT Pub. No.: WO2019/077339
PCT Pub. Date: Apr. 25, 2019

(65) Prior Publication Data
US 2020/0315020 A1     Oct. 1, 2020

(30) Foreign Application Priority Data

Oct. 18, 2017  (EP) ..................................... 17275165
Oct. 18, 2017  (GB) ..................................... 1717121

(51) Int. Cl.
| H05K 3/00 | (2006.01) |
| H05K 3/46 | (2006.01) |
| H05K 1/03 | (2006.01) |
| H05K 1/11 | (2006.01) |
| H05K 3/42 | (2006.01) |

(52) U.S. Cl.
CPC ......... *H05K 3/0011* (2013.01); *H05K 1/0313* (2013.01); *H05K 1/115* (2013.01);
(Continued)

(58) Field of Classification Search
CPC ... H05K 2201/0959; H05K 2201/0116; H05K 2201/09581; H05K 2201/0137;
(Continued)

(56) References Cited

U.S. PATENT DOCUMENTS 4,924,590 A * 5/1990 Hadwiger ............... B32B 15/08
                                               174/250
5,252,383 A * 10/1993 Fukutake ............... H01L 21/481
                                               257/E23.007
(Continued)

FOREIGN PATENT DOCUMENTS

EP    1637261 A1    3/2006
EP    1653789 A1    5/2006

OTHER PUBLICATIONS

International Preliminary Report on Patentability and Written Opinion dated Apr. 30, 2020 issued in PCT/GB2018/052982.
(Continued)

*Primary Examiner* — Roshn K Varghese
(74) *Attorney, Agent, or Firm* — Scully, Scott, Murphy & Presser, PC

(57) ABSTRACT

A circuit assembly (200) is disclosed comprising a substrate (210) and conducting layers (250) on opposing sides of the substrate (210), there being at least one via (220) through the substrate (210), which via (220) forms a conductive path between the conducting layers, wherein the substrate (210) is a foam substrate, and wherein the via (220) is provided with a solid dielectric lining (270) plated with a conducting material (250).

8 Claims, 5 Drawing Sheets

(52) U.S. Cl.
CPC ........... *H05K 3/429* (2013.01); *H05K 3/4644* (2013.01); *H05K 2201/0116* (2013.01); *H05K 2201/0137* (2013.01); *H05K 2201/0753* (2013.01); *H05K 2201/09581* (2013.01)

(58) Field of Classification Search
CPC ......... H05K 2201/0753; H05K 1/0313; H05K 1/112–116; H05K 3/4069; H05K 3/429; H05K 3/0011; H05K 3/4644; H05K 2201/09872; H05K 3/445; H05K 3/425; H05K 2201/015; H05K 2201/0769; H05K 3/426; H05K 3/422; H05K 2203/1147; B29C 44/5627
See application file for complete search history.

(56) References Cited

U.S. PATENT DOCUMENTS

| | | |
|---|---|---|
| 5,733,639 A | 3/1998 | Gosselin |
| 5,821,279 A | 10/1998 | Doi et al. |
| 6,353,999 B1* | 3/2002 | Cheng .................. H05K 3/0032 174/261 |
| 6,479,763 B1 | 11/2002 | Igaki et al. |
| 2002/0000932 A1 | 1/2002 | Metzen |
| 2008/0164057 A1* | 7/2008 | Mori ...................... H05K 3/421 174/262 |
| 2009/0294161 A1* | 12/2009 | Yoshimura ........... H05K 3/4641 174/258 |
| 2010/0108361 A1* | 5/2010 | Sakaguchi ........... H05K 3/0052 174/251 |

OTHER PUBLICATIONS

International Search Report dated Jan. 18, 2019 issued in PCT/GB2018/052982.
European Search Report dated Apr. 26, 2018 issued in EP 17275165.3.
GB Search Report dated Apr. 11, 2018 issued in GB 1717121.6.

* cited by examiner

CIRCUIT ASSEMBLY

FIELD OF THE INVENTION

This invention relates to a circuit assembly, and to methods of manufacturing circuit assemblies. More particularly the invention relates to circuit assemblies formed on a foam substrate and having one or more through-vias coated with a conducting material.

BACKGROUND ART

Electric circuit assemblies, and particularly printed circuit board assemblies, can become heavy when the required thickness between conducting layers is large. This can be the case, for example, in circuits for antennas, microwave circuits or RF striplines. In many applications the weight of the board will not be problematic, but in aerospace applications the weight can be an important factor and performance enhancements can be achieved where weight reductions are made. Weight can also be an important factor in the design of other movable or mobile antennas, such as radar antennas, where the weight of the antenna can impact motion performance. In such applications, and particularly where the selection of the thickness of the dielectric substrate affects the performance of the circuit, the use of foam dielectric substrates is known to achieve reductions in weight. Use of such substrates can reduce weight significantly where large thicknesses are needed in order to achieve particular effects for circuits intended for use at certain frequencies.

For example, typical dielectric materials used in the manufacture of circuit boards has a density of between 1.9 and 3.1 g/cm3, whereas closed cell foam materials have a typical density of around 0.075 g/cm3. This leads to the potential for weight savings in excess of 905. Such weight savings can be highly beneficial, particularly in, for example, aerospace applications, particularly where multi-layer circuit assemblies are required, and in other applications for which antenna weight is an important consideration.

There are however problems in forming conducting vias through foamed substrates. FIG. 1 is a photograph illustrating the effect of a traditional electroplating technique, normally used for providing a copper coating on a through via in a standard circuit board material, on a hole machined in a typical foam substrate. The assembly 100 comprises upper and lower copper layers 110, which are provided as copper-coated laminates that can be bonded to foam substrate 120. It can be seen that there is no effective copper deposition on the surfaces of the foam material that has been exposed by the machining of the hole, indicated generally at 160. Instead, it can be seen that there is an extended region of damage to the foam material, the damage penetrating into the substrate around the hole 160. Copper is deposited only near the opposing surfaces of the substrate where it can adhere to the coated laminate. Conducting through-vias are therefore currently formed manually, bridging the layers using rivets or wire. Such processes are, however, not suitable for mass manufacture.

SUMMARY OF THE INVENTION

It is an aim of the present invention to provide a circuit assembly, and methods of manufacturing circuit assemblies, that mitigate the above mentioned problems so as to enable more efficient manufacture of circuit assemblies using foam substrates.

In accordance with a first aspect of the present invention there is provided a circuit assembly comprising a substrate and conducting layers on opposing sides of the substrate, there being at least one via through the substrate, which via forms a conductive path between the conducting layers, wherein the substrate is a foam substrate, and wherein the via is provided with a solid dielectric lining plated with a conducting material. By providing the foam substrate with a solid dielectric lining the problem of the incompatibility of the standard metal plating processes with the foam material is circumvented, enabling the circuit assemblies to be made that benefit from the advantages of the lightweight foam material whilst still being suitable for manufacture using standard processes. The foam substrate may have a closed cell structure.

The circuit assembly may further comprise solid dielectric layers on the opposing sides of the substrate, and wherein the conducting layers are provided on the solid dielectric layers. The solid dielectric layers may be thin relative to the foam substrate. For example the solid dielectric layers may be less than 10% the thickness of the foam substrate, or less than 5% the thickness of the foam substrate. The solid dielectric lining may be provided as a pillar protruding from one of the solid dielectric layers. In this way the solid dielectric lining can be provided without the complication of using additional materials, and at the same time as one of the dielectric layers.

The invention extends to a multilayer circuit assembly comprising at least two circuit assemblies as described above. The use of foam substrates is particularly beneficial in multilayer assemblies because of the greater weight savings that are possible.

In accordance with a second aspect of the present invention there is provided a method of forming a conducting via through a foam substrate, the foam substrate having two substantially parallel external surfaces, and the method comprising the steps of: machining to define a hole through the foam substrate; providing a solid dielectric lining around the hole, the lining covering the foam substrate in the region of the hole so as to provide a via having a surface suitable for metal plating; and metal plating the via to form the conducting via. The method can be put into effect using standard techniques applied in the manufacture of electrical circuits, so that foam-based circuit assemblies can be manufactured more efficiently at relatively quicker rates.

The step of forming a solid dielectric lining may comprise: filling the hole with a solid dielectric material; and machining the solid dielectric material so as to form a via having an exposed surface suitable for electro-plating.

The method may further comprise the steps of: machining a solid dielectric so as to provide a solid dielectric layer having at least one pillar protruding therefrom, which pillar generally corresponds to the hole defined in the foam substrate; bonding the machined solid dielectric to the foam substrate, such that the at least one pillar of solid dielectric material fills the hole defined in the foam substrate; and machining a hole through the pillar so as to define a via through the foam substrate having a solid dielectric lining.

The method may further comprise the step of bonding a further solid dielectric layer to the foam substrate, such that each of the substantially parallel external surfaces of the foam substrate are covered with a solid dielectric layer.

The solid dielectric layers may be provided with a conducting layer on the outer side of the assembly.

The step of filling the hole with a solid dielectric material may comprise filling the hole with a curable dielectric material in liquid phase, and then curing the curable dielectric material to provide the solid dielectric material. The curable dielectric material may be a polyurethane material. For example, the curable dielectric material may be UV40. UV40 is a readily commercially available material manufactured by Humiseal®.

The method may further comprise the step of defining a circuit pattern in the conducting surface on at least one of the solid dielectric layers.

The invention extends to a method of manufacturing a multilayer circuit assembly, each of the layers having a conducting via formed as described above.

BRIEF DESCRIPTION OF THE DRAWINGS

Embodiments of the invention will now be described by way of example only and with reference to the accompanying drawings, of which.

DETAILED DESCRIPTION

Figure 1:
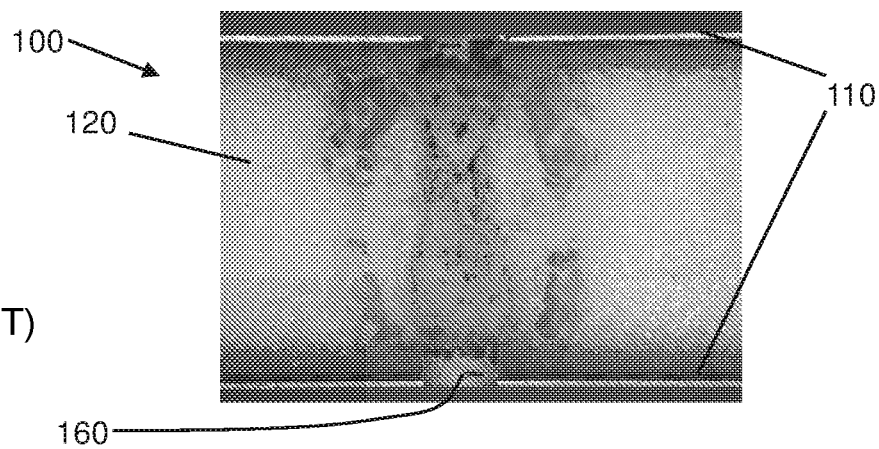
FIG. 1 is a photograph showing a cross section of an electroplated via in a closed-cell foam structure formed in accordance with a prior known technique.
Figure 2:
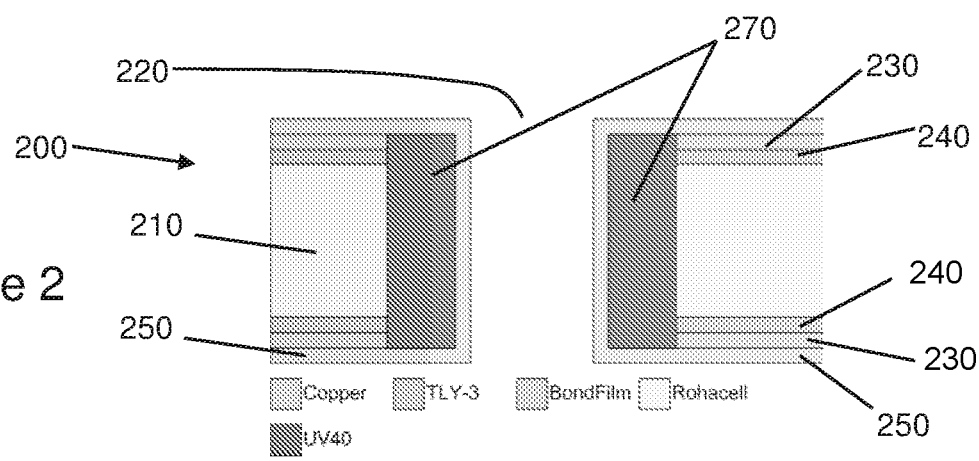
FIG. 2 is a cross-sectional schematic diagram illustrating a circuit assembly having a conducting via in accordance with a first embodiment of the invention.
Figure 3:
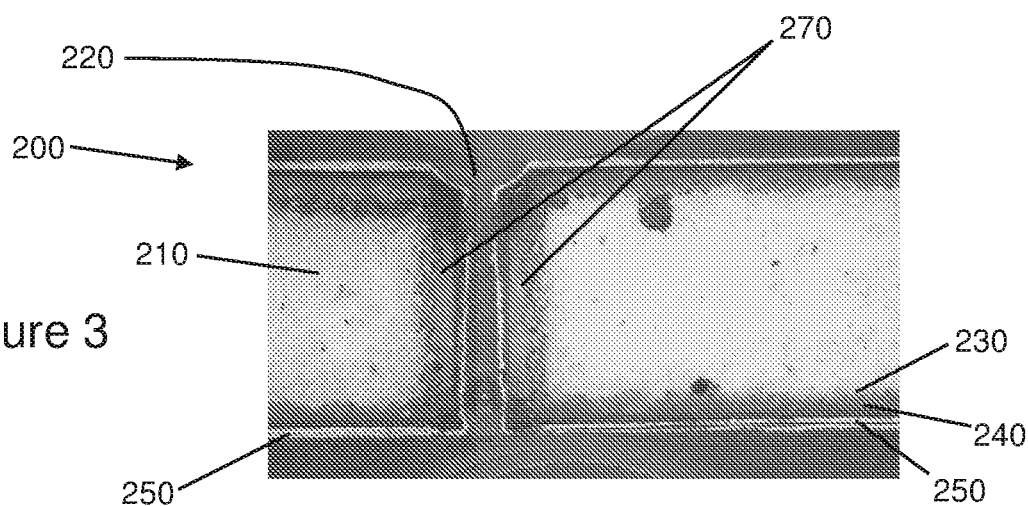
FIG. 3 is a photograph showing a cross section of a circuit assembly having a conducting via in accordance with the first embodiment of the invention.

A part of a circuit assembly 200 according to a first embodiment of the invention and comprising a foamed dielectric substrate 210, in which a conducting via 220 is provided, is illustrated schematically in FIG. 2. A photograph of the circuit assembly 200 is shown in FIG. 3, and like reference numerals are used to refer to the same component parts in these Figures. The circuit assembly has a dielectric substrate 210 which has a closed cell foam structure. The foam substrate may for example be a Rohacell® foam structure, and will have a thickness dependent on the electromagnetic properties required for the circuit assembly. For example, the thickness of the foam substrate may be 3 mm.

Thin layers of a solid dielectric material 230 are bonded to the opposing upper and lower surfaces of the substrate 210 by bond film 240. In the present embodiment the solid dielectric material used is TLY-3, manufactured by Taconic, and has a thickness of 0.127 mm (or 5 thousandth's of an inch). Other solid dielectric materials can be used, and it is also possible to use an alternative thickness; although an appropriate thickness will reflect a balance between the need to achieve mass reductions (which would be impacted should the material become too thick) and the need to ensure that the material can be easily handled.

The surface of the solid dielectric is coated with a conducting layer 250 of copper. Conducting via 220 is seen in cross section. The conducting layer 250 is continuous through via 220 so as to form a continuous conducting path between the opposing surfaces of the assembly. The foam substrate 210, bond film 240 and solid dielectric layer 230 terminate a short distance away from the via 220, the via being lined with a solid dielectric material 270. The copper layer is provided on the surface of the solid dielectric material 270. In the present embodiment the solid dielectric material is UV40.

Figure 4:
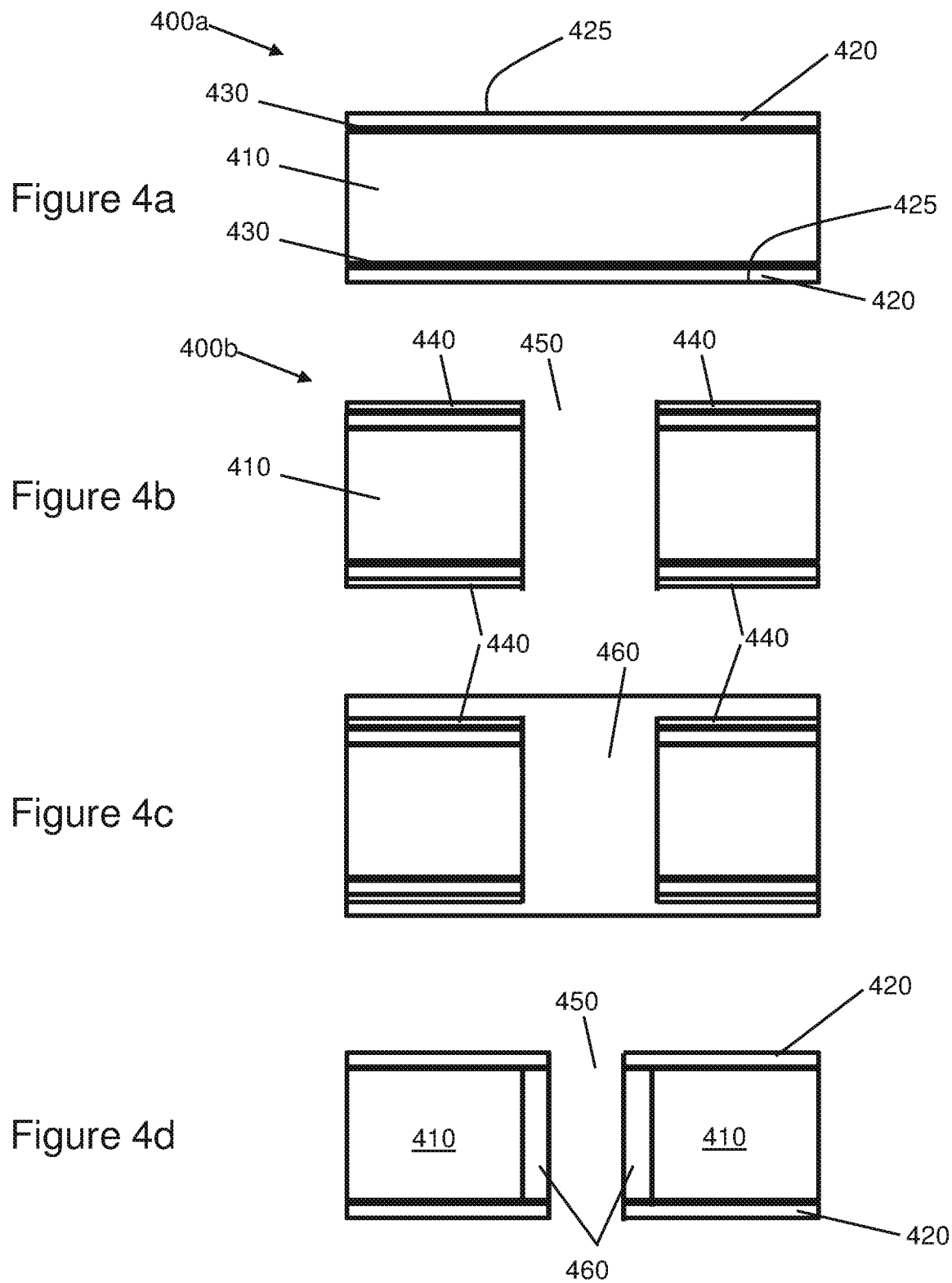
FIGS. 4a to 4d are schematic illustrations of stages in a method for fabricating the circuit assembly of FIGS. 2 and 3.

The fabrication of via 220 can be incorporated into mass-manufacturing processes, and its fabrication using suitable techniques for mass-manufacturing will now be described with reference to FIGS. 4a to 4d, each of which schematically illustrates a stage in the fabrication of the via. FIG. 4a shows a preliminary stage 400a of the manufacturing process, comprising a Rohacell® foam substrate 410, to which thin layers of TLY-3 solid dielectric 420 have been bonded to the foam substrate using bond film 430. These thin layers are commercially available pre-coated with a copper layer, which can be removed from one side prior to bonding to the substrate 410 so that the structure 400a has a conducting copper layer 425 on its upper and lower surfaces.

In a first step of the fabrication of the circuit assembly, a sacrificial material 440, such as a sheet of rigid acrylic, is placed onto both surfaces of the structure. This sacrificial material protects the conducting copper layers 425 already present at the preliminary stage 400a. A hole, indicated at 450, is drilled through the structure at the intended locations of the vias, having a diameter, in the present embodiment, of 3 mm, larger than that required for the via in the final structure. The resulting structure 400b at the end of this first step is shown in FIG. 4b.

In a second step of the fabrication of the circuit assembly, a liquid phase curable dielectric material is applied to the structure 400b. For example, UV40, a standard polyurethane conformal coating manufactured by Humiseal® is used in the present embodiment. In its liquid phase the dielectric spreads across the sacrificial material on the upper surface of the structure, and enters into the hole 450. Sufficient of the curable dielectric is applied to fill the hole 450, and once the hole is filled it can be cured. In the present case UV40 is cured by exposure to ultraviolet light. The length and intensity of the exposure will vary in dependence on the diameter and depth of the hole 450. In the present embodiment an arc lamp system was used and the UV40 was exposed to an intensity of around 0.5 W/cm$^2$ for a few seconds. Once cured the hole 450 is filled with UV40 460 dielectric in its solid phase. The structure 400c at this stage is illustrated in FIG. 4c.

In a third step in the fabrication of the structure, the hole 450 is re-drilled, this time through the solid phase dielectric 460, and to the diameter required for the via in the eventual structure. In the present case a 1 mm hole is drilled through the solid phase dielectric, leaving a solid phase dielectric lining around the hole 460 having a thickness of 1 mm. The actual thickness of the solid dielectric lining is a matter of design choice but it will be appreciated that it should be sufficient, after machining tolerances are taken into account, to prevent any chemical contact with the foam substrate during subsequent electroplating of the via. The sacrificial material 440 is then removed from the surfaces of the structure, along with any solid phase dielectric present on those surfaces, leaving only the lining of the solid phase dielectric around the hole 450, and exposing the upper and lower copper-coated surfaces of the assembly. The foam substrate 410 is now no longer exposed on the sides of the hole 450. The structure 400*d* at this stage is illustrated in FIG. 4*d*.

A fifth step in the fabrication of the circuit assembly is electroplating the exposed surfaces of the structure 400*d* with copper. Both the upper and lower surfaces of the structure, already coated with copper, and the surface of the hole 450, are plated with copper. A standard electroplating process can be applied because the foam substrate 410 is no longer exposed, but covered by the solid phase cured dielectric material at the surfaces of the hole 450, or by the TLY-3 layer 420, on the upper and lower surfaces, that is already copper-coated. As will be appreciated, the resulting structure is that illustrated schematically in FIG. 2 and described above with reference to FIGS. 2 and 3. It will be seen that the structure 200 has both upper and lower conducting surfaces, as well as a conducting through-via at hole 220, as a result of the conducting copper layer 250. It will be appreciated that it will be possible to form any number of conducting through vias using this process, so as to enable the construction of circuit assemblies having connections between conducting layers on either side of a foam substrate at any desired locations. Any necessary patterns can then be formed on the copper layer using standard techniques in order to form the desired electrical circuit.

It will be noted from FIG. 3 that the copper plating of the through via was not achieved evenly in the example shown. The sides of the wall converge towards the upper surface of the circuit assembly, and the copper layer becomes thinner as the walls converge and the via narrows. It is thought that this is due to inadequate curing of the UV40 material, such that there is some creep in the cured UV40 material after the drilling of the via in the third step described above. It is expected that greater exposure to UV light would improve the curing. Close inspection also shows that a small amount of the UV40 dielectric has bled underneath the sacrificial material, so that the copper layer provided on the upper surface can be seen in some places to be formed of two layers.

Figure 5:
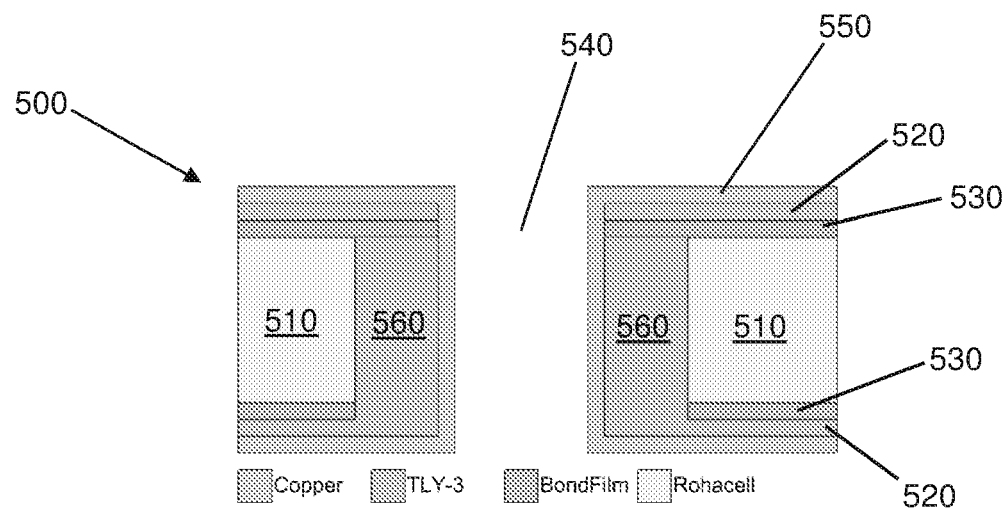
FIG. 5 is a cross-sectional schematic diagram illustrating a circuit assembly having a conducting via in accordance with a second embodiment of the invention.
Figure 6:
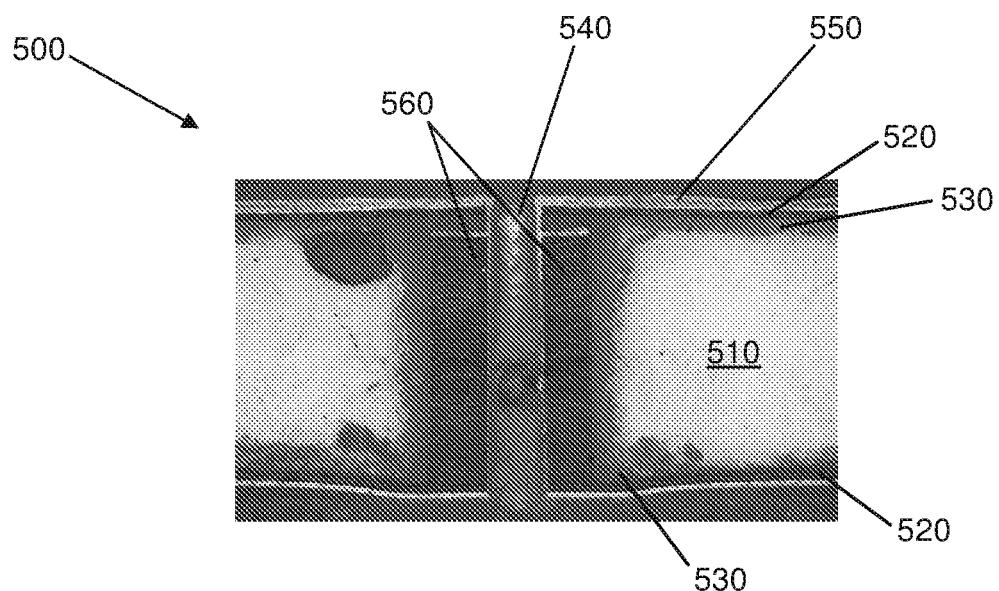
FIG. 6 is a photograph showing a cross section of a circuit assembly having a conducting via in accordance with a second embodiment of the invention.

A part of a circuit assembly 500 in accordance with a second embodiment of the invention is illustrated schematically in cross-section in FIG. 5, and a photograph showing a cross-section through the circuit assembly 500 is shown in FIG. 6. Like reference numerals are used to refer to the same component parts in these Figures. Similar to circuit assembly 200, circuit assembly 500 has a foamed dielectric substrate 510 formed, for example, from Rohacell, with thin solid dielectric layers 520 bonded to the opposing upper and lower surfaces of the substrate 510 with bond film 530. The cross-section shows a through-via 540 that provides a path between the upper and lower surfaces. Copper layer 550 is formed on the upper and lower surfaces of the circuit assembly, and in the through-via 540, such that there is a continuous conducting path between the upper and lower conducting surfaces. Again similarly to assembly 210, the foam substrate 510 terminates a short distance away from the via 540, which is lined with solid dielectric material 560. Assembly 500 differs from assembly 200 in that the solid dielectric material 560 lining the via is provided as a protrusion extending from the lower dielectric layer.

Figure 7A:
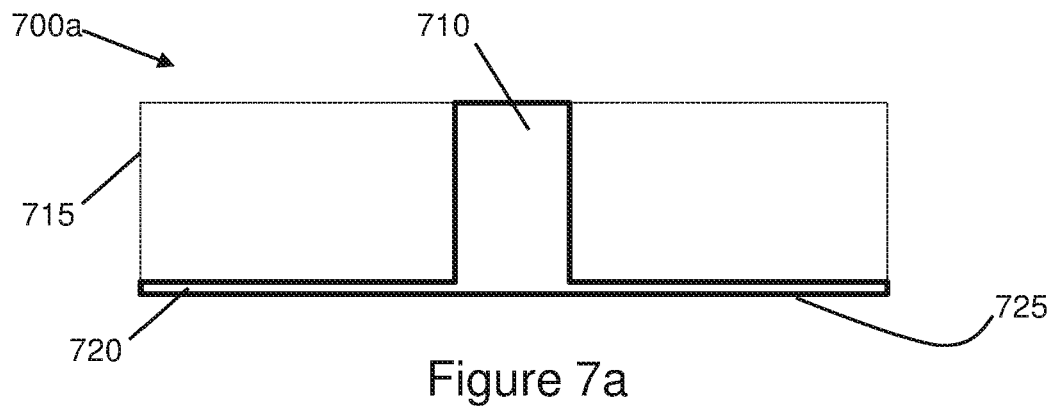
FIGS. 7a to 7c are schematic illustrations of stages in a method for fabricating the circuit assembly of FIGS. 5 and 6.
Figure 7B:
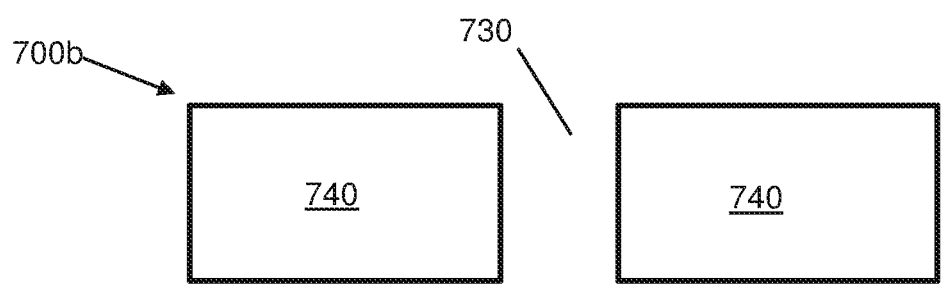
Figure 7C:
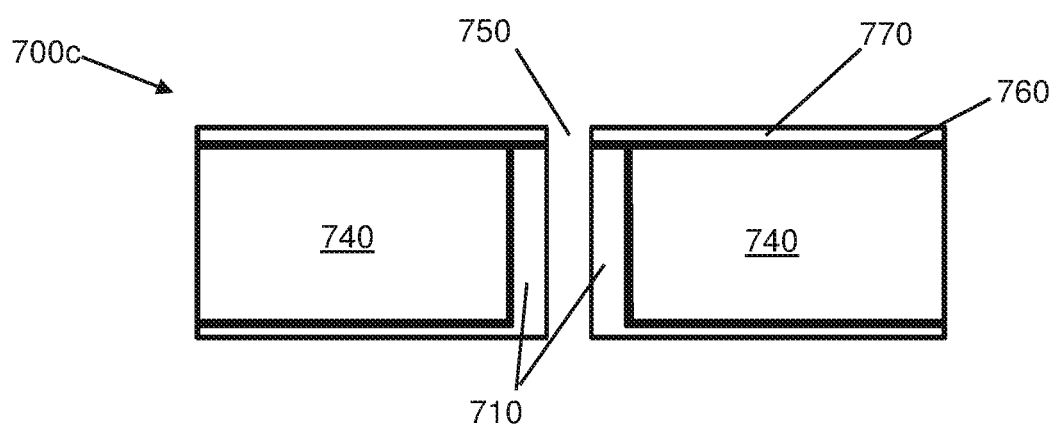

FIGS. 7*a* to 7*c* illustrate stages in the manufacture of the assembly 500. A first stage is the fabrication of the lower dielectric layer, and the protrusions from it that provide the lining to the conducting through via. This lower layer is formed of TLY-3, as described above with reference to FIGS. 2 to 4, and fabricated from a sheet of copper-coated TLY-3 corresponding in shape and thickness to the foamed substrate 510 in the final assembly. Thus the TLY-3 initially has a thickness slightly larger (by 150 μm, in the present embodiment) than that of the foam substrate. Again, as in the case of the method described above with reference to FIGS. 2 to 4, the TLY-3 sheet used is 3 mm thick in this example. This sheet is then machined to a thickness of less than 200 μm (to 150 μm in the present embodiment) except in the locations of the conducting through vias. At these points pillars of TLY-3 are left protruding from the base sheet. In the present embodiment these pillars extend to the full thickness of the starting piece of TLY-3, and have a diameter slightly larger than that required for the conducting through vias. The result of this stage of the processing is part 700*a*, illustrated in FIG. 7*a*, in which a protruding pillar 710 extends upwardly from the base sheet 720, and in which dashed line 715 indicates the original outline of the TLY-3 material from which part 700*a* is machined. The lower surface of part 700*a* retains its copper coating, as indicated by reference numeral 725.

FIG. 7*b* illustrates a part 700*b* formed from the Rohacell closed cell foam substrate material 740. This part has a hole drilled in it at a location corresponding to that of the through-vias and therefore to the locations of the pillar 710 extending upwards in part 700*b*, such as the hole 730. The hole has a diameter that is closely matched to the pillar 710 of part 700*a*. Parts 700*a* and 700*b* can then be bonded together, such that the pillars of part 700*a* mate with the holes formed in part 700*b*. Following the bonding of the solid dielectric layer 700*a* to the foam substrate, a further dielectric layer is bonded to the opposite surface of the foam substrate. The resulting structure is predominantly made of the foam material, but has regions where it is possible to drill through the structure so as to define a hole through the structure having an internal lining of the solid dielectric material TLY-3. FIG. 7*c* illustrates part 700*c*, in which this hole 750 has been formed, and showing the remaining parts of pillar 710, the bond film 760 used to secure the TLY-3 and foam substrate together, and the upper TLY-3 solid dielectric layer 770.

Structure 700*c* can be electroplated in the normal way to form the assembly 500, illustrated in FIG. 5, which corresponds to the structure shown in cross-section in the photograph of FIG. 6. A desired electrical circuit pattern can then be applied using standard techniques. Comparison of FIGS. 5 and 6 shows will be seen to reveal some differences between the schematic of FIG. 5 and the photograph of a cross section manufactured as described above. Firstly, it will be observed that the bond film 530 is present only on the upper and lower surfaces of the foam substrate in FIG. 5, whereas in FIG. 6 it is additionally present between the foam substrate and the solid dielectric TLY-3 lining the via. The additional bond film is present as a result of flow of the bonding agent during the curing process. The bonding agent is provided as a film as shown in FIG. 5, but floods the gap between the TLY-3 560 and the foam substrate 510 during curing. Secondly, it will be seen that there is an additional stub of copper coating along the top of the protrusion of solid dielectric TLY-3 560 present in the photograph in FIG. 6, but not in the schematic of FIG. 5. This is because the thick TLY-3 material from which the lower dielectric is fabricated is supplied with copper plating on both the top and bottom. In manufacture of the lower layer (i.e. the stage shown as 700*a* in FIG. 7*a*) the top copper layer was not removed before construction, so that the top of pillar 710 has a small pad of copper. In initial tests the additional copper was not found to cause any problems.

This method also enables any number of conducting through vias to be formed in a circuit assembly, so that assemblies can be made having connections between conducting layers on either side of a foam substrate at any desired locations. In addition, this second method, described with reference to FIGS. 5 to 7, has some advantages over the first method. For example, the electroplating of the via 520 is more uniform than that shown in FIG. 3. It will also be appreciated that this second method, described above with reference to FIGS. 5 to 7, can be simply modified so as to provide assemblies having multiple intermediate circuit layers, each interconnected using through conducting through vias formed in a similar manner to that described above. Such a method will now be described.

Figure 8A:
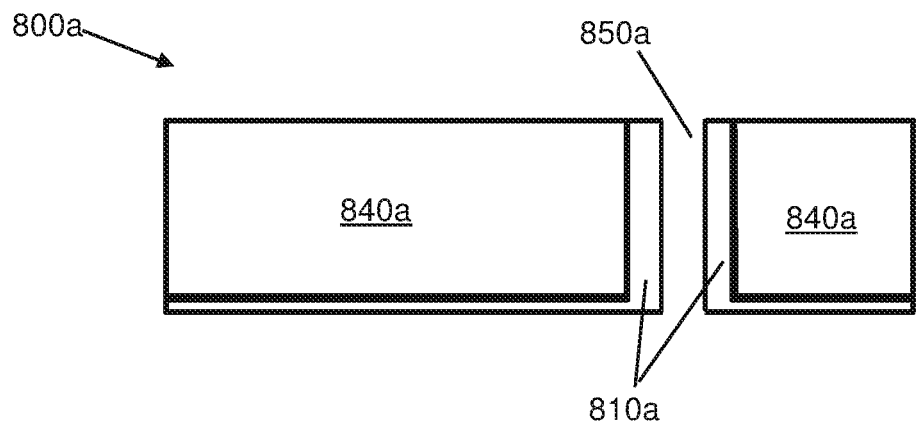
FIGS. 8a and 8b are schematic illustrations of stages in a method for fabricating a multilayer circuit assembly in accordance with a third embodiment of the invention.
Figure 8B:
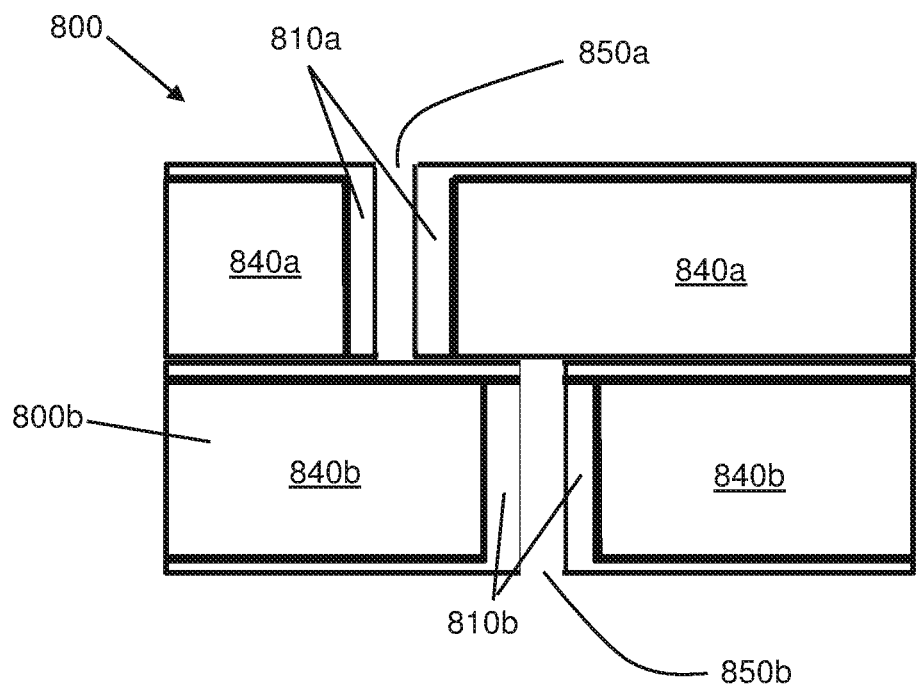

FIGS. 8*a* and 8*b* illustrate stages in the manufacture of a two layer circuit assembly 800 in accordance with a further embodiment of the invention. The method remains as described above to the step of bonding a further simple dielectric layer to the foam substrate. Such a structure 800*a* is shown in FIG. 8*a*, in which the foam substrate 840*a* is bonded to a solid dielectric material, made for example of TLY-3. As described above, a pillar 810*a* of the solid dielectric protrudes upwards from the lower layer and a hole 850*a* is formed through the pillar. Structure 800*a* can then be bonded to a pre-formed circuit assembly 800*b*, to result in the circuit assembly 800 as shown in FIG. 8*b*. As shown in the Figure the structure 800*a* has been inverted such that the solid dielectric layer is uppermost, and the upper copper layer of the assembly 800*b* is bonded to the exposed surface of the foam substrate 840*a*. As will be appreciated, before this stage any necessary pattern definition will have been provided on assembly 800*b* in order to form an desired electrical circuit. Electroplating is then applied to the via 850*a* using standard processes, and the uppermost layer patterned as required. It will be immediately appreciated that a structure having three or four, or any number of layers required, can be manufactured in this way.

Finally, it will be appreciated that the description of example embodiments and their applications provided above is intended to demonstrate a number of principles for the design and operation of such embodiments, both explicit and implied. A number of variations and modifications to the above embodiments will be apparent to the skilled person and are possible without departing from the scope of the invention, which is defined in the accompanying claims.

For example, although specific materials, such as the dielectrics UV40 and TLY-3, and the Rohacell® foam substrate, have been disclosed in the above, it will be appreciated that many solid foamed structures can be used as the foam substrate, whilst other dielectrics will also be suitable for use in place of the UV40 or TLY-3. Such materials will be known to the skilled person. By way of example, other curable liquid phase materials will be suited to use as UV40 in the above, provided that they are chemically compatible with the other steps in the manufacture of the circuit assembly, such as the electroplating step. The TLY-3 can be replaced by many other materials used in printed circuit boards. Other metals than copper may be used for the conducting parts of the circuit; and it will be appreciated that the sacrificial material, described in the above to be a rigid acrylic film, could be provided by many other materials including plastics or metals, or other thin films.

The specific examples of functionality and features described may be applied in any reasonably foreseeable selection or combination consistent with those design principles, and the scope of the present invention as claimed below is intended to include all such selections and combinations.

The invention claimed is:

1. A circuit assembly comprising a substrate, first and second solid dielectric layers bonded on the opposing sides of the substrate, respective first and second layers of bonding film between the first and second solid dielectric layers and the opposing sides of the substrate, the first and second layers of bonding film being parallel to each other and extending in a direction perpendicular to the thickness of the substrate, and conducting layers provided on the solid dielectric layers on opposing sides of the substrate, there being at least one via through the substrate, which via forms a conductive path between the conducting layers, wherein the substrate is a foam substrate, and wherein the via is provided with a solid dielectric lining plated with a conducting material, the solid dielectric lining being provided as a pillar integrally formed with and protruding from the first solid dielectric layer, the solid dielectric lining having a surface facing and closest to the second solid dielectric layer, the surface extending perpendicular to the thickness of the substrate, wherein the second layer of bonding film is between the surface and the second solid dielectric.

2. A circuit assembly as claimed in claim 1 wherein the solid dielectric layers are thin relative to the foam substrate.

3. A multilayer circuit assembly comprising at least two circuit assemblies as claimed in claim 1.

4. A method of forming a conducting via through a foam substrate, the foam substrate having two substantially parallel external surfaces, and the method comprising the steps of:

machining to define a hole through the foam substrate;
providing a solid dielectric separate from the machined foam substrate;
machining the separate solid dielectric so as to provide a solid dielectric layer having at least one integrally formed pillar protruding therefrom, which pillar generally corresponds to the hole defined in the foam substrate, a conducting layer being provided on a side of the solid dielectric opposite to the pillar;
bonding the separate machined solid dielectric to the foam substrate to form a substrate assembly, such that the at least one pillar of solid dielectric material fills the hole defined in the foam substrate; and
machining a hole through the pillar so as to define a via through the foam substrate having a solid dielectric lining; and
metal plating the via to form the conducting via.

5. A method as claimed in claim 4 further comprising the step of bonding a further solid dielectric layer to the foam substrate assembly, such that each of the substantially parallel external surfaces of the foam substrate assembly are covered with a solid dielectric layer.

6. A method as claimed in claim 5 wherein the solid dielectric layers are provided with a conducting layer on the outer side of the foam substrate assembly.

7. A method as claimed in claim 6 further comprising the step of defining a circuit pattern in the conducting layer on at least one of the solid dielectric layers to form a circuit assembly.

8. A method of manufacturing a multilayer circuit assembly, each layer of the multilayer circuit assembly being formed in accordance with the method of claim 7.

\* \* \* \* \*